United States Patent
Sugaya

(10) Patent No.: US 6,232,182 B1
(45) Date of Patent: May 15, 2001

(54) NON-VOLATILE SEMICONDUCTOR MEMORY DEVICE INCLUDING MEMORY TRANSISTOR WITH A COMPOSITE GATE STRUCTURE AND METHOD OF MANUFACTURING THE SAME

(75) Inventor: Fumitaka Sugaya, Tokyo (JP)

(73) Assignee: Nippon Steel Corporation, Tokyo (JP)

(*) Notice: Subject to any disclaimer, the term of this patent is extended or adjusted under 35 U.S.C. 154(b) by 0 days.

(21) Appl. No.: 09/070,754

(22) Filed: May 1, 1998

Related U.S. Application Data

(62) Division of application No. 08/769,351, filed on Dec. 19, 1996, now Pat. No. 5,780,893.

(30) Foreign Application Priority Data

Dec. 28, 1995 (JP) .................................................. 7-353489

(51) Int. Cl.$^7$ .................................................. H01L 21/336
(52) U.S. Cl. ...................... 438/258; 438/521; 438/529; 438/545; 438/549; 438/307; 438/374
(58) Field of Search .................................. 438/257, 258, 438/262, 302, 519, 521, 527, 529, 545–549, 289–291, 374, 307; 257/314–326

(56) References Cited

U.S. PATENT DOCUMENTS

| | | | |
|---|---|---|---|
| 4,835,740 | | 5/1989 | Sato ..................................... 365/185 |
| 5,023,190 | * | 6/1991 | Lee et al. .............................. 437/56 |
| 5,189,497 | * | 2/1993 | Komori et al. ...................... 357/23.5 |
| 5,194,929 | * | 3/1993 | Ohshima et al. .................... 257/326 |
| 5,345,104 | | 9/1994 | Prall et al. ............................ 257/306 |
| 5,366,915 | * | 11/1994 | Kodama ................................ 437/43 |
| 5,464,999 | * | 11/1995 | Bergemont ........................... 257/322 |
| 5,502,321 | | 3/1996 | Matsushita ........................... 257/316 |
| 5,585,293 | | 12/1996 | Sharma et al. ......................... 437/43 |
| 5,793,673 | * | 8/1998 | Pio et al. ......................... 365/185.01 |

FOREIGN PATENT DOCUMENTS

| | | |
|---|---|---|
| 60-110167 | 6/1985 | (JP) . |
| 63-301566 | 12/1988 | (JP) . |

OTHER PUBLICATIONS

Wolf, "Silicon Processing for the VLSI Era, vol. 2,: Process Integration", Lattice Press, pp. 8628–8629.

* cited by examiner

Primary Examiner—Charles Bowers
Assistant Examiner—Erik J Kielin
(74) Attorney, Agent, or Firm—Connolly Bove Lodge & Hutz, LLP

(57) ABSTRACT

A non-volatile semiconductor memory device including a memory cell having a memory transistor and a selection transistor, comprising: a composite gate structure of the memory transistor formed on a surface of a semiconductor substrate at its first region with a first insulating film interposed therebetween and including a laminate of a floating gate electrode, a second insulating film and a control gate electrode; a gate electrode of the selection transistor formed on the surface of the semiconductor substrate at its second region close to the first region with a third insulating film interposed therebetween; and an impurity diffusion layer formed in the semiconductor substrate at its region between the first and second regions and functioning as a drain of the memory transistor, common to a source of the selection transistor, the impurity diffusion layer having at least an extension region extending to a part of the semiconductor substrate disposed under the composite gate structure, the extension region having first, second and third layers wherein the first and second layers include first and second impurities at first and second different concentrations, respectively, and the third layer includes a third impurity at a third concentration higher than any one of the first and second concentrations and a method of manufacturing the non-volatile semiconductor memory device as above-mentioned.

20 Claims, 5 Drawing Sheets

NON-VOLATILE SEMICONDUCTOR MEMORY DEVICE INCLUDING MEMORY TRANSISTOR WITH A COMPOSITE GATE STRUCTURE AND METHOD OF MANUFACTURING THE SAME

RELATED APPLICATIONS

This application is a divisional application of Ser. No. 08/769,351, filed Dec. 19, 1996 now U.S. Pat. No. 5,780,893.

BACKGROUND OF THE INVENTION

1. Field of the Invention

The present invention relates to a non-volatile semiconductor memory device including a memory transistor with a composite gate structure and to a method of manufacturing the same. Particularly, it relates to a non-volatile semiconductor memory device including memory transistor with a composite gate structure, such as an EEPROM or flash memory, and to a method of manufacturing the same.

2. Description of the Related Art

A normal semiconductor device is operated by a power supply voltage of about 3 to 5 V, whereas a non-volatile semiconductor memory device such as an EEPROM or flash memory sometimes needs a high voltage of 10 or more volts for operation of its inner circuit.

For example, in a floating gate EEPROM memory cell, the threshold voltage of the memory transistor changes depending on whether a given amount of electric charge is stored in the floating gate electrode of the memory transistor. The different threshold voltages are respectively determined correspondingly to data of "0" and "1" as stored.

The data in the memory cell can be rewritten by injection of electric charge from the drain into the floating gate electrode through the tunnel oxide film formed under the floating gate electrode, or by extracting electric charge from the floating gate electrode to the drain. For example, when potentials of 15 V and 0 V are, respectively, applied to the control gate electrode of the memory transistor and to the drain diffusion layer, and the substrate portion thereof, and the source diffusion layer is rendered to a floating state, electrons are injected from the drain diffusion layer into the floating gate electrode by the FN tunnel phenomenon through the tunnel oxide film. In addition, when potentials of 0 V and 15 V are, respectively, applied to the control gate electrode and the substrate portion, and to the drain diffusion layer and the source diffusion layer is brought to a floating state, electrons are extracted from the floating gate electrode to the drain diffusion layer by the FN tunnelling phenomenon through the tunnel oxide film.

The FN tunnel phenomenon mentioned above is effected generally more efficiently as the impurity concentration of the train diffusion layer is increased.

On the other hand, the rewriting operation of the memory cell is more efficient as the electric field applied to the tunnel oxide film is increased. In other words, the memory cell rewriting speed increases with an increase of the voltage applied to the drain diffusion layer. However, if a high voltage is applied to the drain diffusion layer, the avalanche phenomenon occurs in the PN junction between the drain diffusion layer and the substrate portion. Thus, the voltage that can be applied to the drain diffusion layer is limited by the avalanche breakdown voltage. For example, as disclosed in JP-A-60-110167, the avalanche breakdown voltage greatly depends on the PN junction between the drain and the substrate, and it is decreased with increase of the impurity concentration of the drain.

Also, as disclosed in JP-A-60-110167, when the impurity concentration of the drain is rendered higher, an electric field applied to the PN junction between the drain and the substrate becomes higher at the operation of reading out of data so that the hot carrier is greatly deteriorated, resulting in the reduction of its reliability.

In the prior art, as described above, there exists a problem that when the drain of the memory transistor is made with high impurity concentration in order to improve the rewriting speed in EEPROM or the like, the breakdown voltage of the PN junction between the drain and the substrate is decreased, resulting in decreased reliability against the hot carrier deterioration. On the contrary, when the drain diffusion layer of the memory transistor is made with lower impurity concentration to raise the breakdown voltage of the PN junction between the drain and the substrate to improve the reliability against the hot carrier deterioration, the rewriting speed of the memory cell is reduced.

In short, the improvement in the rewriting speed of EEPROM or the like, and the improvement in the breakdown voltage of the PN junction between the drain and the substrate and the reliability against the hot carrier deterioration are a trade-off with each other and no technique for satisfying both at the same time has heretofore been developed.

In addition, as disclosed in JP-A-63-301566, and "Reliable Profiled Lightly-Doped Drain (PLD) Cell for High Density Submicron EPROMs and Flash EEPROMs" by K. Yoshikawa et al., Abstracts of the 20th (1988 International) Conference on Solid State Devices and Materials, Tokyo, 1988, pp. 165–168, a PLD cell is proposed for preventing the reduction of the reliability of EEPROM by suppressing the tunnel leakage current between bands. However, the PLD cell is a memory cell in which data is written by hot electron injection, and it is required to provide the gate electrode with sidewalls to be used as a mask when forming the impurity diffusion layers formed by ion injection. This increases the number of processes for manufacturing EEPROMs.

SUMMARY OF THE INVENTION

It is an object of the invention to provide a non-volatile semiconductor memory device, such as an EEPROM and flash memory, which is capable of rewriting at high speed and preventing the reduction of the breakdown voltage of the PN junction between the drain and the substrate, and/or the hot carrier deterioration, thereby increasing the reliability, and to a method of manufacturing such a memory device.

According to a first aspect of the invention, there is provided a non-volatile semiconductor memory device comprising: a composite gate structure formed on a surface of a semiconductor substrate with a first insulating film interposed therebetween and including a laminate of a floating gate electrode; a second insulating film and a control gate electrode; and a pair of impurity diffusion layers formed in the semiconductor substrate at its regions on both sides of the composite gate structure. At least one of said impurity diffusion layers has an extension region extending to a part of the semiconductor substrate disposed under the composite gate structure, the extension region having first, second, and third layers, the first and second layers including first and second impurities at first and second different concentrations, respectively, and the third layer including a third impurity at a third concentration higher than any one of the first and second concentrations.

According to a second aspect of the invention, there is provided a non-volatile semiconductor memory device including a memory transistor and a selection transistor, the semiconductor memory device comprising: a composite gate structure of the memory transistor formed on a surface of a semiconductor substrate at its first region with a first insulating film interposed therebetween and including a laminate of a floating gate electrode, a second insulating film, and a control gate electrode; a gate electrode of the selection transistor formed on the surface of the semiconductor substrate at its second region close to the first region with a third insulating film interposed therebetween; and an impurity diffusion layer formed in the semiconductor substrate at its region between the first and second regions and functioning as a drain of the memory transistor, common to a source of the selection transistor, the impurity diffusion layer having at least an extension region extending to a part of the semiconductor substrate disposed under the composite gate structure, the extension region having first, second and third layers wherein the first and second layers include first and second impurities at first and second different concentrations, respectively, and the third layer includes a third impurity at a third concentration higher than any one of the first and second concentrations.

The present invention provides a method of manufacturing a non-volatile semiconductor memory device including a memory cell having a memory transistor and a selection transistor, comprising the steps of: (a) forming a composite gate structure of the memory transistor on a surface of a semiconductor substrate at its first region with a first insulating film interposed therebetween so as to include a laminate of a floating gate electrode, a second insulating film and a control gate electrode, and a gate electrode of the selection transistor on the surface of the semiconductor substrate at its second region close to the first region with a third insulating film interposed therebetween; (b) introducing first and second impurities of a conductivity type different from that of the semiconductor substrate and having different diffusion coefficients into the semiconductor substrate at a third region disposed between the first and second regions where a drain of the memory transistor, common to a source of the selection transistor, is to be formed by using the composite gate structure and the gate electrode as a mask and thermally diffusing the first and second impurities thereby forming first and second impurity diffusion layers including the first and second impurities at first and second different concentrations, respectively; (c) and introducing a third impurity of the same conductivity type as that of the first impurity into each of the third region, a fourth region where a source of the memory transistor is to be formed and a fifth region where a drain of the selection transistor is to be formed, so as to form a third impurity diffusion layer including the third impurity in each of the third, fourth, and fifth regions, wherein at least the third diffusion layer formed in the third region includes the third impurity at a third impurity concentration higher than any of the first and second concentrations.

According to the invention, since at least one of the impurity diffusion layers of the memory transistor of the EEPROM is formed to have a three-layer structure, it is possible to increase the rewriting speed and prevent the hot carrier deterioration. In addition, since the impurity diffusion layer of the three-layer structure can be formed without providing the sidewalls on the gate electrode, the processes for producing the EEPROM can be simplified.

DESCRIPTION OF THE PREFERRED EMBODIMENTS

Figure 1:
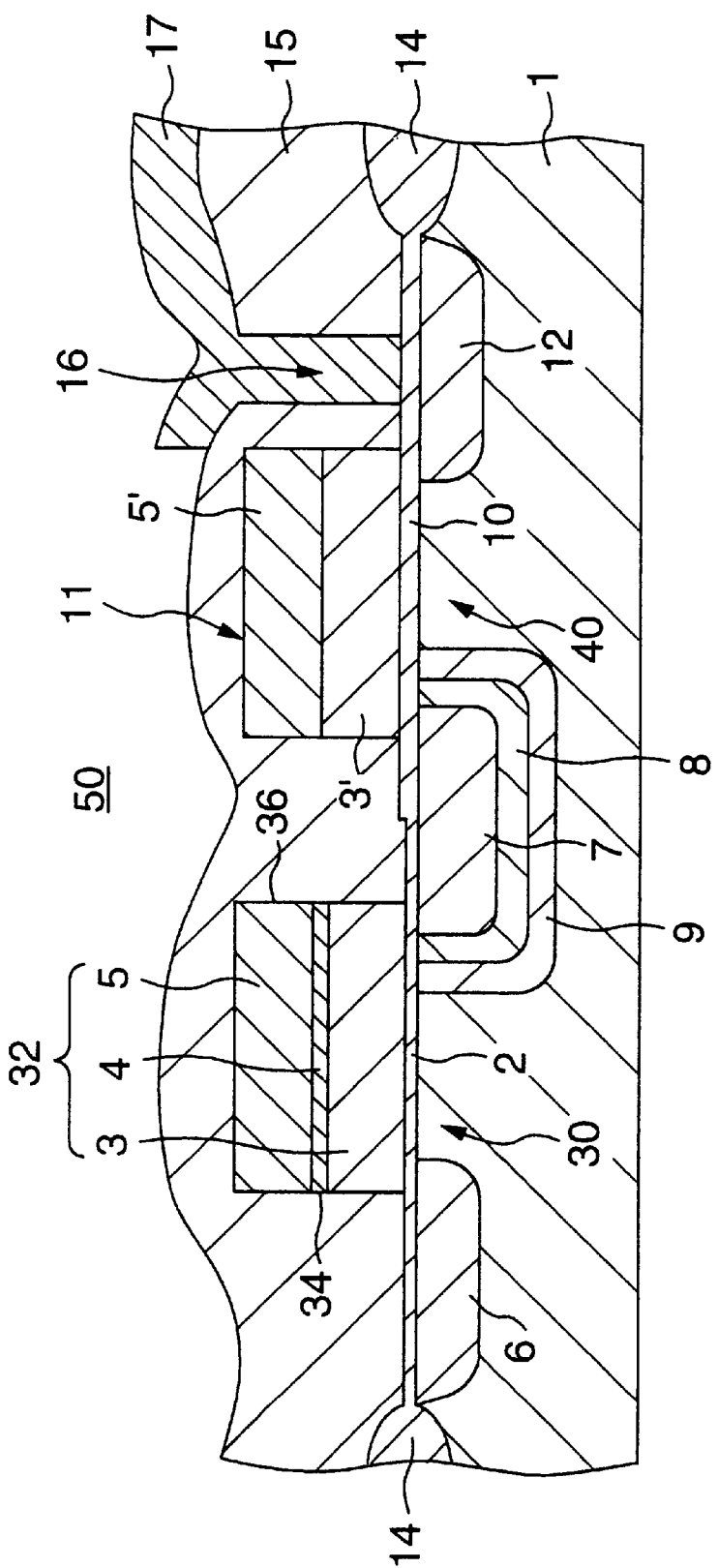
FIG. 1 is a cross-sectional view of a memory cell of EEPROM of the first embodiment of the invention.

The structure of the EEPROM of the first embodiment, which can be electrically rewritten bit by bit, will be described with reference to FIGS. 1 and 2. The EEPROM has a plurality of memory cells 50 arranged in a matrix of rows and columns on a semiconductor substrate 1. Each memory cell 50, as shown in FIG. 1, includes a memory transistor 30 in which data can be rewritten by injecting electrons from the drain diffusion layer through the tunnel oxide film into the floating gate by the FN tunnelling phenomenon or by extracting electrons from the floating gate to the drain diffusion layer, and a selection transistor 40. The structure of each memory cell will be described with reference to FIG. 1.

As illustrated in FIG. 1, the tunnel oxide film 2 having a thickness of 80 to 100 Å is formed on a silicon substrate 1 (specific resistance of about 10 $\Omega/cm^2$) which includes a p-type impurity at an impurity concentration of about $1\times10^{15}$ atoms/$cm^3$, and the floating gate electrode 3 of a polycrystalline silicon film is formed at a thickness of 1500 to 2000 Å on the tunnel oxide film 2. On the floating gate electrode 3, there is formed an interlayer ONO insulating film 4 of a three-layer structure (not shown) including a silicon oxide film of 100 to 150 Å thick, a silicon nitride film of 100 to 150 Å thick and a silicon oxide film of 100 to 150 Å thick laminated in that order from the bottom. Moreover, a control gate electrode 5 of a polycrystalline silicon film is deposited at a thickness of 1500 to 2000 Å on the interlayer insulating film 4.

An n-type impurity diffusion layer 6 including mainly arsenic at an impurity concentration of about $2.0\times10^{20}$ atoms/$cm^3$ is formed in the surface of the silicon substrate 1 at its portion close to one side 34 of a composite gate structure 32 formed of a laminate of a floating gate electrode 3, an interlayer insulating film 4 and a control gate electrode 5. This impurity diffusion layer provides a source of the memory transistor 30 having the composite gate structure 32.

In addition, an n-type impurity diffusion layer 7, which includes mainly arsenic at an impurity concentration of about $1.0\times10^{21}$ atoms/$cm^3$, is formed in the surface of the silicon substrate 1 at its portion close to the other side 36 of the composite gate structure 32. Moreover, an n-type impurity, diffusion layer 8, which also includes mainly arsenic at an impurity concentration of about $7.0\times10^{20}$ atoms/$cm^3$, is formed so as to surround the n-type impurity diffusion layer 7. The n-type diffusion layer 8 partially overlaps with, or faces to, the floating gate electrode 3 with the tunnel oxide film 2 interposed therebetween. At the outside of the n-type impurity diffusion layer 8, an n-type impurity diffusion layer 9, which includes mainly phosphorus at an impurity concentration of about $1.0 \times 10^{18}$ atoms/cm$^3$, is formed so as to surround the n-type diffusion layer 8. A part of the n-type diffusion layer 9 also faces the floating gate electrode 3 with the tunnel oxide film 2 interposed therebetween. These three n-type diffusion layers 7, 8 and 9 constitute the drain region of the memory transistor 30. The impurity diffusion layer 7, as illustrated, extends into respective portions of the semiconductor substrate disposed under the composite gate structure 32 and the gate electrode 11, respectively.

As shown in FIG. 1, the selection transistor 40 is formed adjacent to the memory transistor 30. In other words, a gate oxide film 10 with a thickness of 300 to 350 Å thicker than the tunnel oxide film 2 is formed on the surface of the silicon substrate 1, and the gate electrode 11 of a polycrystalline silicon film is formed on the gate oxide film 10 at a thickness of 3000 to 3500 Å. The polycrystalline silicon film constituting the gate electrode 11 may be of a two-layer structure of a lamination of two films 3' and 5'. The source region of this selection transistor 40 is common to the drain of the memory transistor 30 which is formed of the three layers of n-type diffusion layers 7, 8 and 9. Through this three-layer drain region of the three impurity diffusion layers, the selective transistor 40 is electrically connected to the memory transistor 30. In addition, an n-type impurity diffusion layer 12, which includes mainly arsenic at an impurity concentration of about $2.0 \times 10^{21}$ atoms/cm$^3$, is formed to provide a drain of the selection transistor in the surface of the silicon substrate 1 at its portion close to the other side of the gate electrode 11 of the selection transistor 40 opposite to the one side close to the drain region of the three impurity diffusion layers 7, 8 and 9.

This selection transistor is used to select the individual memory transistor, and the memory transistor selected by the switching operation of the selection transistor is rewritten or read. In other words, the EEPROM of this embodiment can be altered (write and erase) bit by bit.

In FIG. 1, reference numeral 14 represents the field oxide film for element isolation, 15 the interlayer insulating film such as BPSG, 16 a contact hole reaching the drain of the selection transistor, and 17 the aluminum wiring conductor.

Figure 2:
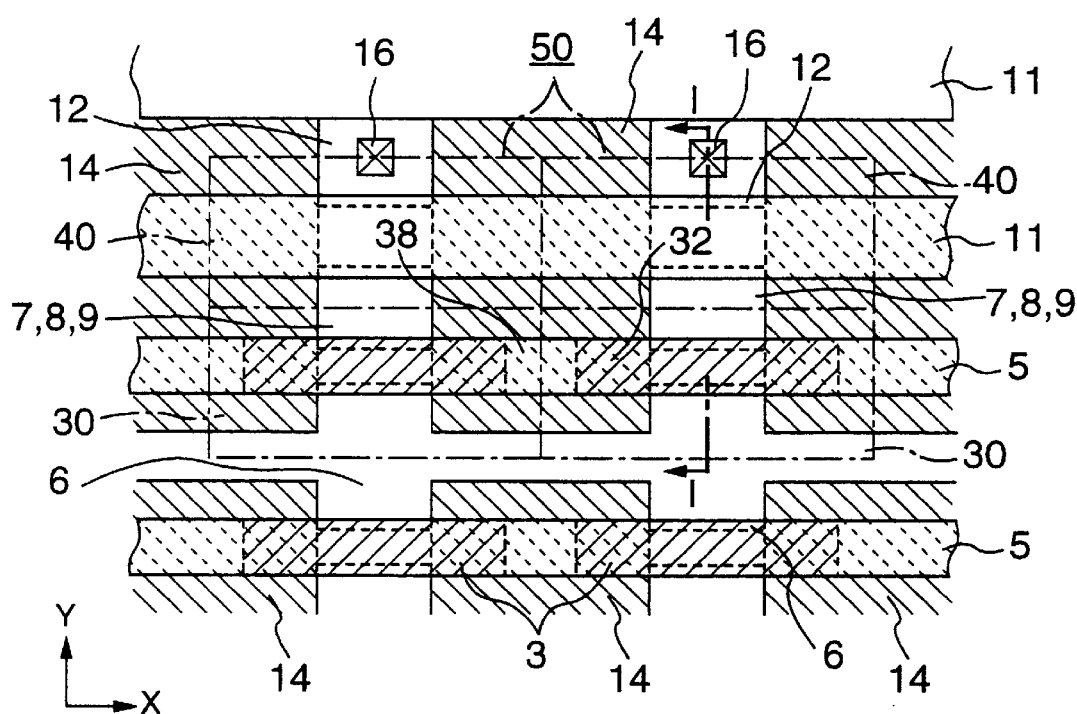
FIG. 2 is a plan view of the memory cell of EEPROM of the first embodiment of the invention.

FIG. 2 is a plan view of the EEPROM memory cell of this embodiment. In FIG. 2, like components corresponding to those in FIG. 1 are identified by the same reference numerals. FIG. 1 shows a cross-sectional view taken along a line I—I in FIG. 2.

As described above, a plurality of memory cells 50, each including the memory transistor 30 and the selection transistor 40, are arranged in a matrix of rows in the X direction and columns in the Y direction. FIG. 2 illustrates two memory cells adjacent in the X direction of the matrix arrangement. The composite gate structures 32 of the memory transistors 30 of the memory cells adjacent in the X direction are arranged substantially along a straight line, and the control gate electrodes 5 of the composite gate structures are formed of a single continuous polycrystalline silicon film. Moreover, the gate electrodes 11 of the selection transistors 40 of the memory cells adjacent in the X direction are also arranged substantially along a straight line, and formed of a single continuous polycrystalline silicon film. When the gate electrode 11 is formed of the two-layer structure including two polycrystalline silicon films 3' and 5', only the upper polycrystalline silicon layers 5' may be formed of a single continuous polycrystalline silicon film.

The EEPROM memory cell of the above structure is able to make FN tunnelling at high efficiency and rewrite at high speed by the relatively high-concentration n-type impurity diffusion layers 7 and 8 that constitute the drain region of the memory transistor. In addition, since the relatively low-concentration n-type impurity diffusion layer 9 is provided around the outside of the relatively high-concentration n-type impurity diffusion layers 7 and 8, the electric field strength in the PN junction between the drain and the substrate is lowered so that the breakdown voltage of the junction can be increased and the reliability against the hot carrier deterioration can be improved.

According to the above embodiment, the drain region of the memory transistor is formed of three impurity diffusion layers, including impurities at concentrations varied step-wise; however, the drain region of the memory transistor may be made of four or more impurity diffusion layers having impurity concentrations varied stepwise.

According to the above embodiment, the impurities in the impurity diffusion layers 7 and 8 include mainly arsenic and the impurity diffusion layer 9 includes mainly phosphorus. However, the impurities in the impurity diffusion layers 7, 8 and 9 are not limited to arsenic and phosphorus, but it is sufficient to select each of the impurities in the impurity diffusion layers 7 and 8 to have a diffusion coefficient smaller than that of the impurity in the impurity diffusion layer 9. If, for example, phosphorus is included as an impurity in the impurity diffusion layer 9, the impurity to be introduced into each of the impurity diffusion layers 7 and 8 may be antimony or bismuth having a smaller diffusion coefficient than that of phosphorus. Also, the impurity introduced into the impurity diffusion layer 7 is not necessarily the same as that introduced into the impurity diffusion layer 8.

A method of manufacturing the non-volatile semiconductor memory device as shown in FIG. 1 will be described with reference to FIGS. 3A to 3D.

Figure 3A:
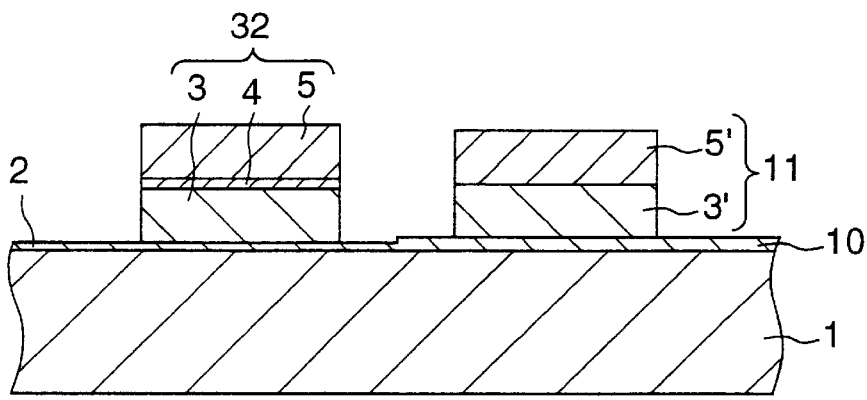
FIGS. 3A to 3D are cross-sectional views corresponding to the cross-section of FIG. 1 at respective steps in a method of manufacturing the EEPROM of the first embodiment of the invention.

First, as illustrated in FIG. 3A, the gate structures of the memory transistor and selection transistor are formed respectively on the p-type silicon substrate 1.

In other words, after element-isolation arrangement is provided in the p-type silicon substrate 1 by the field oxide film 14 (see FIGS. 1 and 2), the tunnel oxide film 2 is formed on the surface of the p-type silicon substrate 1 at a first region where the memory transistors are to be formed, and the gate oxide film 10 that is thicker than the tunnel oxide film is formed on the surface of the p-type silicon substrate 1 at a second region where the selection transistors are to be formed. These two oxide films, having different thicknesses, are formed by two steps of thermal oxidations using oxide-resistant masks or, by making the gate oxide film 10 by CVD after making the tunnel oxide film 2 by thermal oxidation or by forming an oxide film having a larger thickness by thermal oxidation or the CVD method and then etching its part where the tunnel oxide film 2 is to be formed.

Then, a first polycrystalline silicon film for the floating gate electrodes 3 of the memory transistors 30 and the lower layers 3' of the gate electrodes 11 of the selection transistors 40 is deposited over the entire surface of the substrate to cover the tunnel oxide film 2 and gate oxide film 10. In the first region where the memory transistors are to be formed, the first polycrystalline silicon film is partially removed along a stripe extending in the Y direction through a part corresponding to the floating gate electrodes adjacent to each other in the X direction, so that the first polycrystalline silicon film is formed at the first region in a pattern such that it is separated at a part corresponding to the gap between the floating gate electrodes adjacent to each other in the X direction. Thereafter, the interlayer insulating film 4 of ONO film is deposited over the entire surface of the first region while masking the second region. The mask is removed from the second region and a second polycrystalline silicon film, which is used for forming the control gate electrodes 5 of the composite gate structures and the upper layers 5' of the gate electrodes 11 of the selection transistors 40, is deposited over the entire surface of the substrate 1. In the first region, lamination of the first polycrystalline silicon film, the interlayer insulating film and the second polycrystalline silicon film is formed in a pattern indicated by reference numeral 5 in FIG. 2, that is a pattern of conductive films each extending in the X direction through the control gate electrodes 5 aligned in each row of the X direction. In the second region, a lamination of the first polycrystalline silicon film 3' and the second polycrystalline silicon film 4' is formed in a pattern indicated by reference numeral 11 in FIG. 2, that is a pattern of conductive films each extending in the X direction through the gate electrodes 11 aligned in each row of the X direction. Thus, in the first region, the composite gate structures of the memory transistors, each having the floating gate, the interlayer insulating film and the control gate, are formed such that the control gates of the composite gate structures aligned in each row of the X direction are electrically connected. In the second region, the gate electrodes of the selection transistors, each having the first polycrystalline silicon film and the second polycrystalline silicon film, are preferably formed so that the gate electrodes aligned in each row of the X direction are electrically connected.

By making the gate electrode of each selection transistor by two layers of polycrystalline silicon films, the composite gate structure of the memory transistor is substantially equal in height to the gate electrode of the selection transistor so that it is possible to reduce the level difference at the step portion of the interlayer BPSG insulating film to be formed later.

Figure 3B:
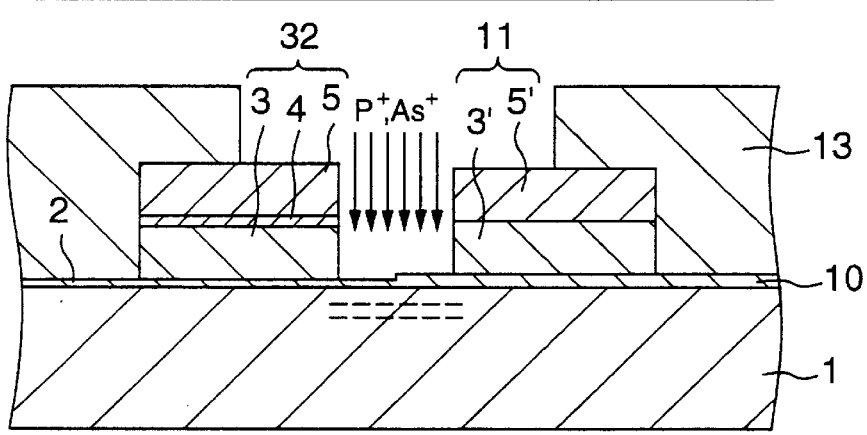

As illustrated in FIG. 3B, a photoresist 13 is coated over the substrate 1 in a pattern such that an opening is formed at a portion disposed between the composite gate structure 32 and the gate electrode 11 where the drain region of the memory transistor (source region of the selection transistor) is to be formed. Then, phosphorus ions (P$^+$) are implanted, by using the mask of this photoresist 13, into the p-type silicon substrate 1 at a dose of $1.0 \times 10^{13}$ to $3.0 \times 10^{13}$ atoms/cm$^2$ by energy of 60 to 70 keV. In addition, arsenic ions (As$^+$) are implanted into the p-type silicon substrate 1 at a dose of $5.0 \times 10^{15}$ to $2.0 \times 10^{16}$ atoms/cm$^2$ by energy of 60 to 100 keV. In this case, phosphorus ions and arsenic ions may be implanted in reverse order.

Figure 3C:
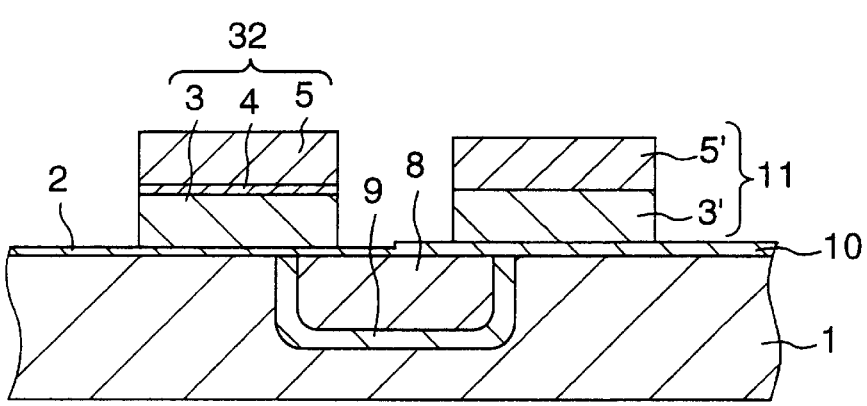

Then, as shown in FIG. 3C, a thermal treatment is carried out at a temperature of about 900° C. for about 10 minutes to diffuse the impurities implanted into the p-type silicon substrate 1. At this time, since the diffusion speed of phosphorus is higher than that of arsenic, the n-type impurity diffusion layer 9, containing mainly phosphorus as an impurity, is formed outside of the n-type impurity diffusion layer 8 that contains mainly arsenic as an impurity, as illustrated. The n-type impurity diffusion layer 9 contains mainly phosphorus as a at an impurity concentration of $1 \times 10^{18}$ to $1 \times 10^{19}$ atoms/cm$^3$, and the n-type impurity diffusion layer 8 contains mainly arsenic as an impurity at a concentration of $5 \times 10^{20}$ to $2 \times 10^{21}$ atoms/cm$^3$. At this time, the n-type impurity diffusion layer 8 and n-type impurity diffusion layer 9 extend, due to lateral diffusion of the impurity, to a portion of the substrate under the floating gate electrode 3 of the memory transistor and to a portion of the substrate under the gate electrode 11 of the selection transistor, respectively.

Figure 3D:
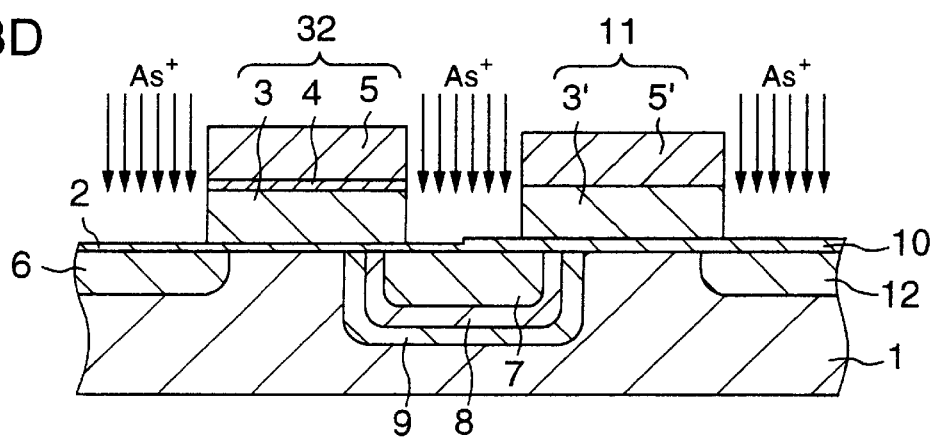

As illustrated in FIG. 3D, after removing the photoresist 13, arsenic ions (As$^+$) are implanted into the substrate 1 at a dose of $1.0 \times 10^{15}$ to $5.0 \times 10^{15}$ atoms/cm$^2$ by energy of 60 to 80 keV by using the composite gate structure 32 of the memory transistor, the gate electrode 11 of the selection transistor, and a field oxide film (not shown) as a mask. Then, thermal treatment is carried out at a temperature of about 900° C. for about ten minutes to activate the implanted impurities. Thus, as illustrated, the n-type impurity diffusion layer 6 is formed to provide the source region of the memory transistor and the n-type diffusion layer 7 as well as the n-type impurity diffusion layer 8 and n-type impurity diffusion layer 9, are formed to provide the drain region of the memory transistor (source region of the selection transistor). Further, the n-type impurity diffusion region 12 is formed to provide the drain region of the selection transistor. The impurity diffusion layer 7 extends to a portion of the substrate disposed under the composite gate structure 32 and also to a portion of the substrate disposed under the gate electrode 11 by the thermal treatment.

Thereafter, although the detailed description is omitted, the EEPROM memory cell is manufactured by forming the interlayer BPSG insulating film or the like, forming the contact holes in the interlayer insulating film, and forming aluminum wiring conductors.

The above manufacturing method makes use of the difference between the diffusion speeds of arsenic and phosphorus so that the n-type impurity diffusion layer 9 is formed outside of the n-type impurity diffusion layer 8. In this case, the diffusion layer 9 contains, as an impurity, mainly phosphorus at a lower concentration than that of the diffusion layer 8 that contains mainly arsenic as an impurity. Therefore, by a simple and easily controllable process, it is possible to make the structure of the relatively low-concentration n-type impurity diffusion layer surrounding the relatively high-concentration n-type impurity diffusion layer.

Figure 4A:
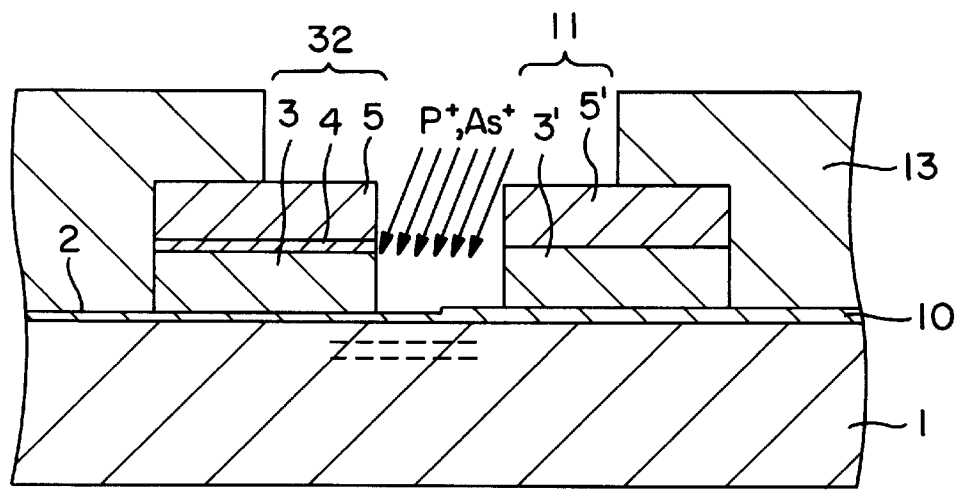
FIGS. 4A and 4B are cross-sectional views corresponding to the cross-section of FIG. 1 at respective steps in a method of manufacturing the EEPROM of the second embodiment of the invention.
Figure 4B:
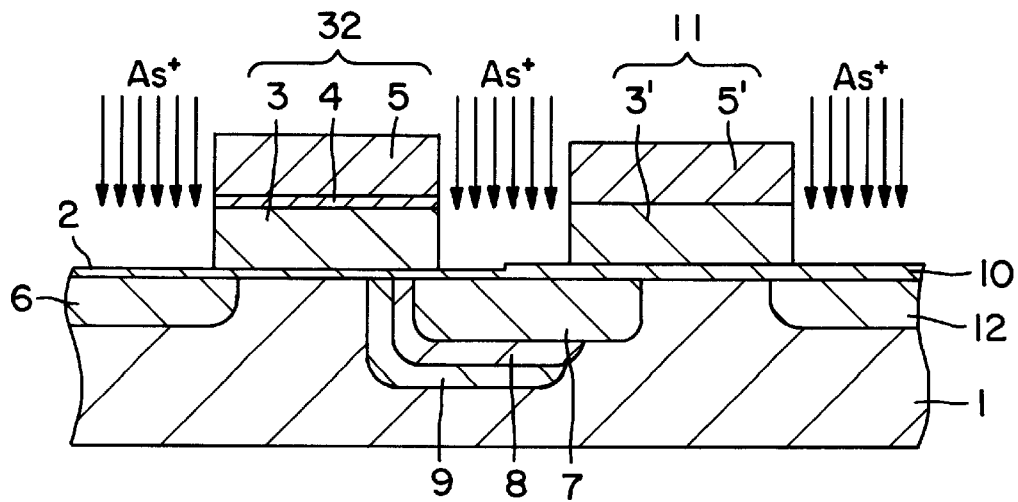

The second embodiment of the invention will be described with reference to FIGS. 4A and 4B. In FIGS. 4A and 4B, like components corresponding to those in FIGS. 3A to 3D are identified by the same reference numerals. The plan view of the second embodiment is substantially the same as the plan view of the first embodiment shown in FIG. 2.

According to the second embodiment, as shown in FIG. 4A, phosphorus ions (P$^+$) and arsenic ions (As$^+$) are introduced by oblique ion-implantation into the substrate 1 by using the photoresist mask 13, in place of the step as shown in FIG. 3B in the first embodiment, thereby to have the implantation more urged toward the composite gate structure of the memory transistor. Therefore, the n-type impurity diffusion layer 8 mainly containing an impurity of arsenic, and the n-type impurity diffusion layer mainly containing an impurity of phosphorus, which are formed by subsequent heat treatment, are deviated toward the composite gate structure of the memory transistor and separated from the underside of the gate electrode 11 of the selection transistor.

Then, as illustrated in FIG. 4B, like the process of the first embodiment shown in FIG. 3D, arsenic ions (As$^+$) are substantially perpendicularly implanted into the p-type silicon substrate 1 by using, as a mask, the composite gate structure of the memory transistor, the gate electrode 11 of the selective transistor and a field oxide film (not shown). Thus, as illustrated, the drain region of the memory transistor (source region of the selection transistor) is formed to a structure such that its portion close to the floating gate electrode 3 of the memory transistor has the three-layer structure of the n-type impurity diffusion layer 7 mainly containing an impurity of arsenic at the highest concentration, the n-type impurity diffusion layer 8 mainly containing an impurity of arsenic at a next higher concentration and the n-type impurity diffusion layer 9 mainly containing an impurity of phosphorus at the lowest concentration and its portion close to the gate electrode 11 of the selective transistor has substantially none of the n-type impurity diffusion layers 8 and 9. In the second embodiment, the n-type impurity diffusion layer 7 partially extends to a part of the semiconductor substrate 1 disposed under the composite gate structure 32 and partially extends to the underside of the gate electrode 11.

Therefore, according to the second embodiment, on the side close to the floating gate electrode 3 of the memory transistor, FN tunnelling can be made with high efficiency, and rewriting speed can be increased by virtue of the relatively high-concentration n-type impurity diffusion layers 7 and 8 providing the drain region of the memory transistor. In addition, the electric field in the PN junction between the drain and the substrate is weakened by virtue of the relatively low-concentration n-type impurity diffusion layer 9 surrounding the relatively high-concentration n-type impurity diffusion layers 7 and 8, so that the breakdown voltage can be increased and the reliability against the hot carrier deterioration can be improved. Thus, the second embodiment has the same effect as the first embodiment. Moreover, in the second embodiment, since the n-type impurity diffusion layers 8 and 9 are not present under the gate electrode 11 of the selection transistor, the channel length of the selection transistor can be assured, and thus erroneous operation can be prevented.

The third embodiment of the invention is described with reference to FIGS. 5A to 5D. In FIGS. 5A to 5D, like components corresponding to those in FIGS. 3A to 3D and FIGS. 4A and 4B are identified by the same reference numerals. The plan view of the third embodiment is substantially the same as the plan view of the first embodiment shown in FIG. 2 except that the reference numerals "12" and "6" in FIG. 2 are considered as being changed to —12, 19, 21— and —6, 18, 20— respectively.

Figure 5A:
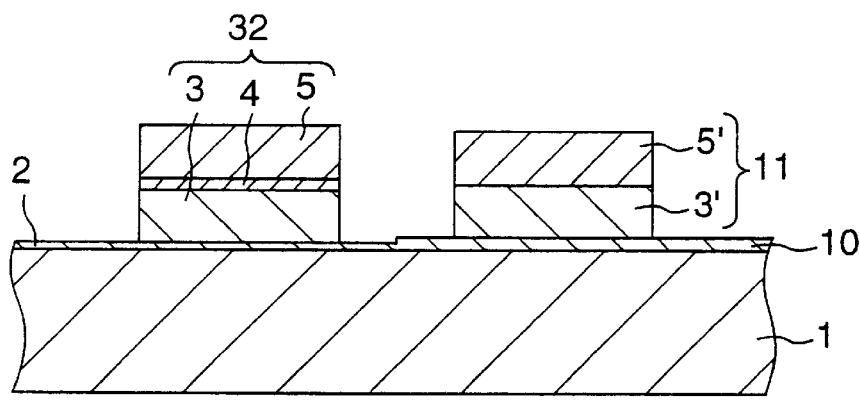
FIGS. 5A to 5D are cross-sectional views corresponding to the cross-section of FIG. 1 at respective steps in a method of manufacturing the EEPROM of the third embodiment of the invention.

First, as illustrated in FIG. 5A, the composite gate structure 32 of the memory transistor and the gate electrode 11 of the selection transistor are formed on the p-type silicon substrate 1 by the same process as in the first embodiment.

Figure 5B:
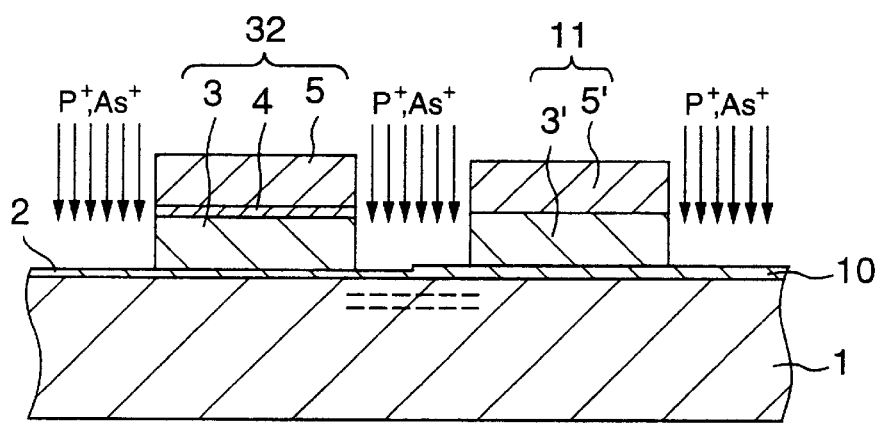

Then, as shown in FIG. 5B, phosphorus ions (P$^+$) and arsenic ions (As$^+$) are implanted into the p-type silicon substrate 1, without using the photoresist mask 13 as used in the first embodiment, but instead using, as a mask, the composite gate structure of the memory transistor, the gate electrode 11 of the selection transistor, and the field oxide film (not shown).

Figure 5C:
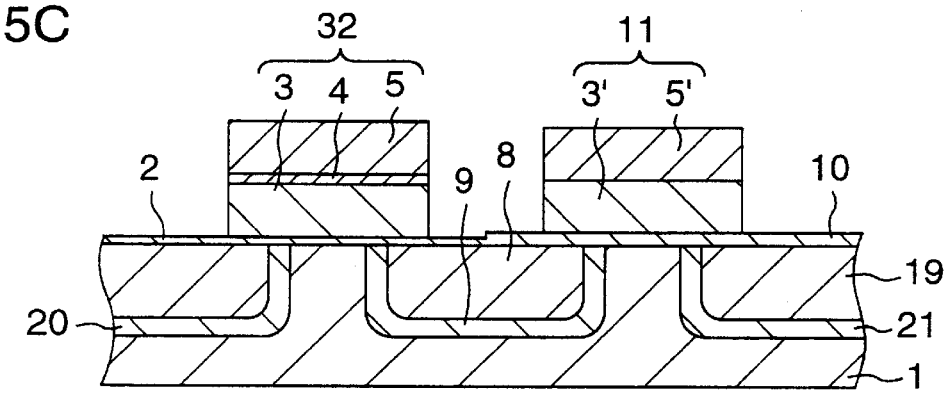

Thereafter, as illustrated in FIG. 5C, the thermal treatment is carried out at a temperature of about 900° C. for about 10 minutes to thereby diffuse the implanted impurities in the p-type silicon substrate 1 similarly as in the first embodiment. Thus, the drain region of the memory transistor (source region of the selection transistor) is formed of the n-type impurity diffusion layer 8 mainly containing an impurity of arsenic and the n-type impurity diffusion layer 9 mainly containing an impurity of phosphorus and surrounding the diffusion layer 8 as in the first embodiment. In this embodiment, the source region of the memory transistor also includes an n-type impurity diffusion layer 18 mainly containing arsenic as an impurity and an n-type impurity diffusion layer 20 mainly containing an impurity of phosphorus and surrounding the diffusion layer 18. Moreover, the source region of the selection transistor is formed of an n-type impurity diffusion layer 19 mainly containing an impurity of arsenic and an n-type impurity diffusion layer 21 surrounding the diffusion layer 19 and mainly containing an impurity of phosphorus.

Figure 5D:
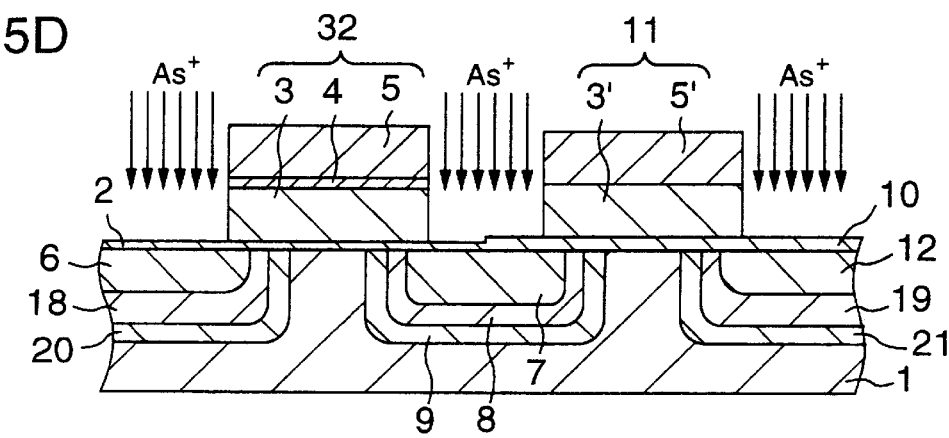

Then, as shown in FIG. 5D, arsenic ions (As$^+$) are implanted into the p-type silicon substrate 1 by using, as a mask, the composite gate structure 32 of the memory transistor, the gate electrode 11 of the selection transistor and the field oxide film (not shown). In addition, the thermal treatment is carried out at a temperature of about 900° C. for about 10 minutes to thereby activate the implanted impurities. Thus, as illustrated, the n-type impurity diffusion layer 6 is formed to provide the source region of the memory transistor together with the n-type impurity diffusion layers 18 and 20, the n-type impurity diffusion layer 7 being formed to provide the drain region of the memory transistor (source region of the selection transistor) together with the n-type impurity diffusion layers 8 and 9, and the n-type impurity diffusion layer 12 formed to provide the drain region of the selection transistor together with the n-type impurity diffusion layers 19 and 21.

In the third embodiment, the n-type impurity diffusion layer 7 extends to a part of the semiconductor substrate disposed under the composite gate structure 32 and to underside of the gate electrode 11. Also, the n-type impurity diffusion layer 6 extends to a part of the substrate disposed under the composite gate structure 32 and the n-type impurity diffusion layer 12 extends to a part of the semiconductor substrate disposed under the gate electrode.

In the second and third embodiments, the impurities to be introduced into the impurity diffusion layers may be selected such that the diffusion coefficients of the impurities to be introduced into the impurity diffusion layers 7 and 8 are smaller than that of the impurity to be introduced into the impurity diffusion layer 9 like in the first embodiment.

According to the invention, it is possible to provide a non-volatile semiconductor memory device such as an EEPROM which is improved in the rewriting speed, the breakdown voltage of the junction between the drain and the substrate and the reliability against the hot carrier deterioration. In addition, since it is not required to form the sidewalls to any of the composite gate structure of the memory transistor and the gate electrode of the selection transistor to be used as a mask in ion-implantation, the manufacturing process is simplified.

What is claimed is:

1. A method of manufacturing a non-volatile semiconductor memory device including a memory cell having a memory transistor and a selection transistor, said method comprising the steps of:

forming a composite gate structure of the memory transistor on a surface of a semiconductor substrate at its first region with a first insulating film interposed therebetween so as to include a laminate of a floating gate electrode, a second insulating film and a control gate electrode and a gate electrode of the selection transistor on the surface of the semiconductor substrate at its second region close to the first region with a third insulating film interposed therebetween;

introducing first and second impurities of a conductivity type different from that of the semiconductor substrate and having different diffusion coefficients into the semiconductor substrate at a third region disposed between the first and second regions where a drain of the memory transistor, common to a source of the selection transistor, is to be formed by using the composite gate structure and the gate electrode as a mask and thermally diffusing the first and second impurities thereby forming first and second impurity diffusion layers including the first and second impurities at first and second different concentrations, respectively, said first diffusion layer enclosing said second diffusion layer; and introducing a third impurity of the same conductivity type as that of the first impurity into each of the third region, a fourth region where a source of the memory transistor is to be formed and a fifth region where a drain of the selection transistor is to be formed, so as to form a third impurity diffusion layer including the third impurity in each of the third, fourth and fifth regions, wherein at lest the third diffusion layer formed in the third region includes the third impurity at a third impurity concentration higher than any of the first and second concentrations, and which third impurity diffusion layer is enclosed by said first and second impurity diffusion layers.

2. A method according to claim 1, wherein said first impurity includes mainly phosphorus, and said second impurity includes mainly arsenic.

3. A method according to claim 1, wherein said first impurity includes mainly phosphorus, and said second impurity includes mainly antimony.

4. A method according to claim 1, wherein said first impurity includes mainly phosphorus, and said second impurity includes mainly bismuth.

5. A method according to claim 1, wherein said second concentration is higher than said first concentration.

6. A method according to claim 1, wherein said first impurity diffusion layer surrounds said second impurity diffusion layer.

7. A method according to claim 1, wherein said first impurity has a diffusion coefficient larger than that of said second impurity.

8. A method according to claim 1, wherein:

said first concentration is in a range of $1 \times 10^{18}$ atoms/cm$^3$ to $1 \times 10^{19}$ atoms/cm$^3$; and said second concentration is in a range of $5 \times 10^{20}$ atoms.cm$^3$ to $2 \times 10^{21}$ atoms/cm$^3$.

9. A method according to claim 1, wherein:

said semiconductor substrate is of a first conductivity type; and said first to third impurities are of a second conductivity type opposite to said first conductivity type.

10. A method according to claim 1, wherein said memory transistor has such a structure as to write data by injecting electrons from said drain into said floating gate electrode by FN (Fowler-Nordheim) tunnelling phenomenon through said first insulating film.

11. A method of manufacturing a semiconductor device, said method comprising the steps of:

(a) forming an insulating film on a semiconductor substrate;

(b) forming a pattern having at least one layer on said insulating film;

(c) forming a first impurity diffusion layer to extend into a first portion of said semiconductor substrate disposed under said pattern;

(d) forming a second impurity diffusion layer to extend into a second portion of said semiconductor substrate disposed under said pattern above said first impurity diffusion layer; and (e) forming a third impurity diffusion layer to extend into a third portion of said semiconductor substrate disposed under said pattern above said second impurity diffusion layer, whereby first, second and third overlapping diffusion layers are formed, of the same conductivity-type and said first and second diffusion layers enclose said third diffusion layer.

12. A method according to claim 11, wherein said step (b) includes forming a composite gate structure including a laminate of a first conductive film, a second insulating film and a second conductive film.

13. A method according to claim 12, wherein said step (b) includes forming said first conductive film as a floating gate electrode of a memory cell transistor included in a memory using FN (Fowler-Nordheim) tunnelling phenomenon.

14. A method according to claim 12, wherein said step (b) includes simultaneously forming another pattern of said first and second conductive films as a gate electrode of a selection transistor, said selection transistor selecting one of a plurality of memory cell transistors formed in said semiconductor substrate.

15. A method according to claim 11, wherein said step (b) includes forming said pattern as a gate electrode of a selection transistor, said selection transistor selecting one of a plurality of memory cell transistors formed in said semiconductor substrate.

16. A method according to claim 11, wherein said steps (c) to (e) include:

implanting at least one impurity into said semiconductor substrate through said insulating film; and performing thermal treatment for said semiconductor substrate so as to diffuse said at least one impurity into said semiconductor substrate.

17. A method according to claim 11, wherein said step (c) and (d) include forming said first and second impurity diffusion layers in said semiconductor substrate at only one of both sides of said pattern.

18. A method according to claim 11, wherein said steps (c) to (e) include forming said first to third impurity diffusion layers in said semiconductor substrate at both sides of said pattern.

19. A method according to claim 11, wherein said step (d) includes forming said second impurity diffusion layer to be surrounded by said first impurity diffusion layer.

20. A method according to claim 12, wherein:

said steps include forming a non-volatile memory having said composite gate structure.

* * * * *